(12) United States Patent
Fukui

(10) Patent No.: US 10,788,544 B2
(45) Date of Patent: Sep. 29, 2020

(54) MAGNETIC SENSOR

(71) Applicant: TDK CORPORATION, Tokyo (JP)

(72) Inventor: Takato Fukui, Tokyo (JP)

(73) Assignee: TDK CORPORATION, Tokyo (JP)

( * ) Notice: Subject to any disclaimer, the term of this patent is extended or adjusted under 35 U.S.C. 154(b) by 253 days.

(21) Appl. No.: 15/770,196

(22) PCT Filed: Oct. 20, 2016

(86) PCT No.: PCT/JP2016/081105
§ 371 (c)(1),
(2) Date: Apr. 21, 2018

(87) PCT Pub. No.: WO2017/082011
PCT Pub. Date: May 18, 2017

(65) Prior Publication Data
US 2018/0313907 A1 Nov. 1, 2018

(30) Foreign Application Priority Data
Nov. 9, 2015 (JP) .............................. 2015-219451

(51) Int. Cl.
*G01R 33/00* (2006.01)
*G01R 33/09* (2006.01)
*G01R 33/02* (2006.01)

(52) U.S. Cl.
CPC ...... *G01R 33/0011* (2013.01); *G01R 33/0005* (2013.01); *G01R 33/02* (2013.01); *G01R 33/09* (2013.01)

(58) Field of Classification Search
CPC ............. G01R 33/0005; G01R 33/0011; G01R 33/02; G01R 33/09; G01R 33/0206;
(Continued)

(56) References Cited

U.S. PATENT DOCUMENTS 4,296,377 A * 10/1981 Ohkubo .................. H01L 43/08
257/E43.004
2005/0122100 A1* 6/2005 Wan ........................ H05K 1/181
324/247
(Continued)

FOREIGN PATENT DOCUMENTS

JP 05212152 H 8/1993
JP 2006258741 A 9/2006
(Continued)

*Primary Examiner* — Tung X Nguyen
*Assistant Examiner* — Robert P Alejnikov, Jr.
(74) *Attorney, Agent, or Firm* — Young Law Firm, P.C.

(57) ABSTRACT

A magnetic sensor includes a sensor chip 30 including an element-forming surface 31 provided with a magnetism detection elements MR1-MR4, a magnetic member 40 including a first side surface 41 facing the element-forming surface 31, and a circuit board 20 including a mounting surface 21 on which the sensor chip 30 and the magnetic member 40 are mounted. The sensor chip 30 and the magnetic member 40 are mounted on the circuit board such that the element-forming surface 31 and the first side surface 41 are substantially orthogonal to the mounting surface 21 of the circuit board 20. Because the sensor chip 30 and the magnetic member 40 are mounted on the circuit board 20 in a horizontal state, the magnetic member 40 can be supported in a stable manner even when the length of the magnetic member 40 is large.

5 Claims, 8 Drawing Sheets

(58) Field of Classification Search
CPC .......................... G01R 33/028; G01R 33/038; G01R 33/1215; B64G 1/366; G11B 2005/0016; G11B 2005/3996; Y10T 428/1107
USPC .................................. 324/252, 244, 207.21
See application file for complete search history.

(56) References Cited

U.S. PATENT DOCUMENTS

| | | | |
|---|---|---|---|
| 2006/0038560 A1* | 2/2006 | Kurumado | G01P 3/487 324/252 |
| 2006/0208727 A1 | 9/2006 | Matsumoto et al. | |
| 2009/0284254 A1* | 11/2009 | Kasajima | G01R 33/0005 324/207.21 |
| 2010/0188078 A1* | 7/2010 | Foletto | G01R 33/0023 324/251 |
| 2011/0234215 A1* | 9/2011 | Ausserlechner | G01R 33/0047 324/244 |
| 2013/0015839 A1* | 1/2013 | Franke | G01R 33/0011 324/117 H |
| 2015/0035528 A1 | 2/2015 | Nishioka et al. | |

FOREIGN PATENT DOCUMENTS

| | | | | |
|---|---|---|---|---|
| JP | 2009276159 A | 11/2009 | | |
| JP | 5985847 B2 * | 9/2013 | ............. | G01R 15/20 |
| JP | 2013195381 A | 9/2013 | | |
| KR | 2011-0017774 | 2/2011 | | |

* cited by examiner

MAGNETIC SENSOR

TECHNICAL FIELD

The present invention relates to a magnetic sensor, and particularly relates to a magnetic sensor including a magnetic member for concentrating magnetic flux to a sensor chip.

BACKGROUND ART

Magnetic sensors using a magnetoresistive element or the like are widely used in ammeters, magnetic encoders, and the like. There is a case where magnetic sensors are provided with a magnetic member for concentrating magnetic flux to a sensor chip. In this case, the magnetic member is placed on an element-forming surface of the sensor chip (see Patent Document 1).

CITATION LIST

Patent Document

Patent Document 1: Japanese Patent Application Laid-open No. 2009-276159

SUMMARY OF INVENTION

Technical Problem to be Solved by Invention

However, because sensor chips are generally small, placing a magnetic member on a sensor chip is not easy, and reliably fixing a sensor chip and a magnetic member has been difficult. Particularly, when a magnetic member with a large length in a direction perpendicular to an element-forming surface is used, the support on a sensor chip becomes highly unstable, possibly causing the magnetic member to fall or bend in some cases.

Therefore, an object of the present invention is to provide a magnetic sensor capable of supporting a magnetic member in a stable manner, even when a magnetic member with a large length in a direction perpendicular to an element-forming surface is used.

Means for Solving Problem

A magnetic sensor according to the present invention includes a sensor chip including an element-forming surface provided with a magnetism detection element, a magnetic member including a first side surface facing the element-forming surface, and a circuit board including a mounting surface on which the sensor chip and the magnetic member are mounted, wherein the sensor chip and the magnetic member are mounted on the circuit board such that the element-forming surface and the first side surface are substantially orthogonal to the mounting surface of the circuit board.

According to the present invention, because the sensor chip and the magnetic member are mounted on the circuit board in a horizontal state, the magnetic member can be supported in a stable manner even when the length of the magnetic member is large.

In the present invention, it is preferable that the magnetic member further includes a second side surface substantially parallel to the first side surface and located on an opposite side of the first side surface, and an area of the second side surface is larger than an area of the first side surface. Accordingly, because more magnetic flux can be concentrated, the sensitivity of the magnetic sensor can be enhanced. In this case, a length of the second side surface in a direction perpendicular to the mounting surface can be larger than a length of the first side surface in the direction perpendicular to the mounting surface.

In the present invention, it is preferable that the magnetism detection element includes first to fourth magnetoresistive elements, wherein the first and second magnetoresistive elements are located on one side as viewed from the first side surface of the magnetic member, and the third and fourth magnetoresistive elements are located on the other side as viewed from the first side surface of the magnetic member. With this configuration, a bridge circuit using the four magnetoresistive elements is formed, thereby allowing magnetism detection to be performed with high sensitivity.

In this case, it is preferable that the magnetic sensor according to the present invention further includes an auxiliary magnetic member mounted on the circuit board, wherein the sensor chip further includes first and second side surfaces substantially orthogonal to the element-forming surface and located respectively on the one side and the other side as viewed from the first side surface of the magnetic member, and the auxiliary magnetic member is mounted on the circuit board so as to cover at least a part of the first and second side surfaces. With this configuration, the magnetic flux input to the element-forming surface is curved in directions of the first and second side surfaces, thereby allowing magnetism detection to be performed with even higher sensitivity.

Advantageous Effects of Invention

According to the present invention, it is possible to provide a magnetic sensor capable of supporting a magnetic member in a stable manner, even when a magnetic member with a large length in a direction perpendicular to an element-forming surface is used.

MODE FOR CARRYING OUT THE INVENTION

Preferred embodiments of the present invention will now be explained in detail with reference to the drawings.

Figure 1:
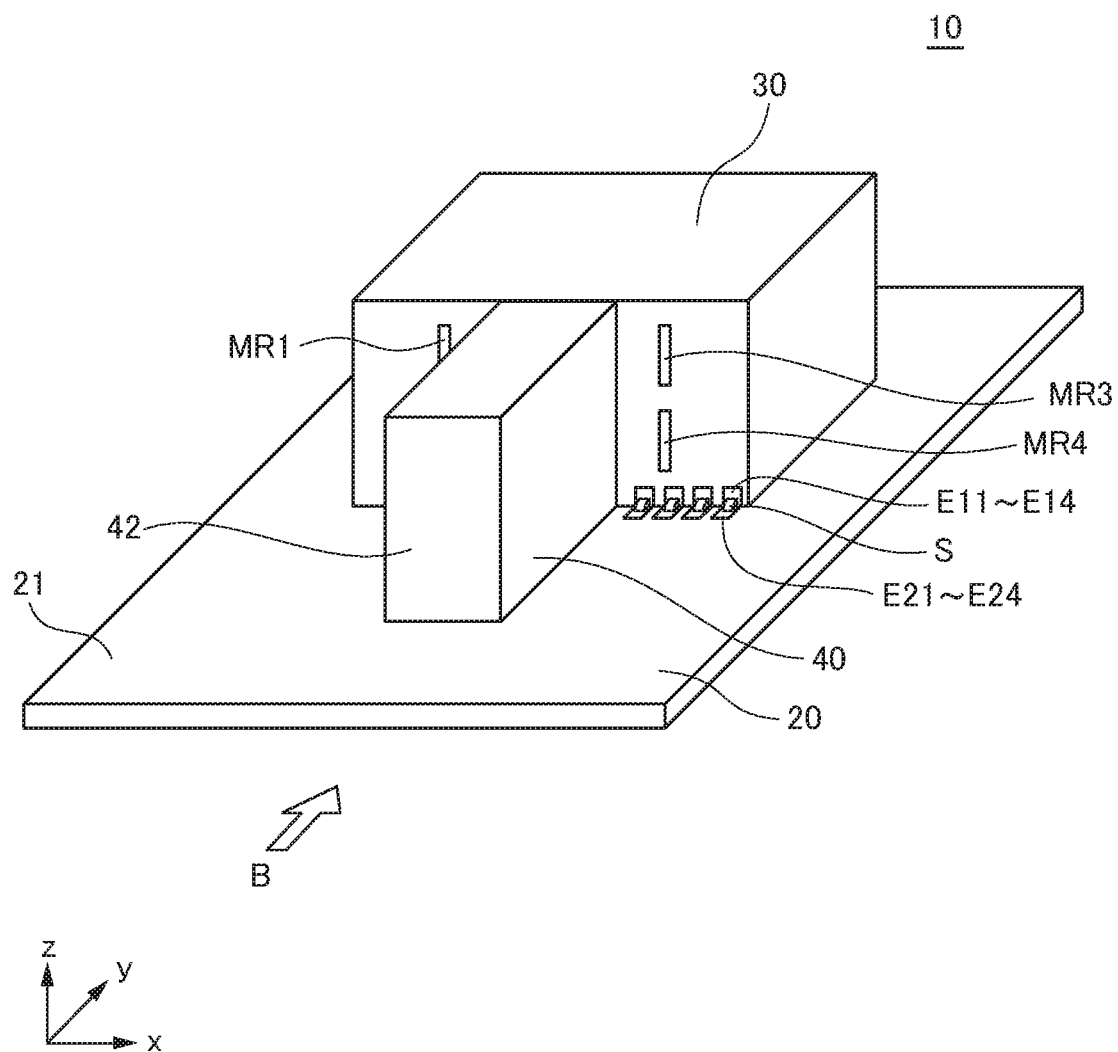
FIG. 1 is a schematic perspective view illustrating an external appearance of a magnetic sensor 10 according to a preferred embodiment of the present invention.
Figure 2:
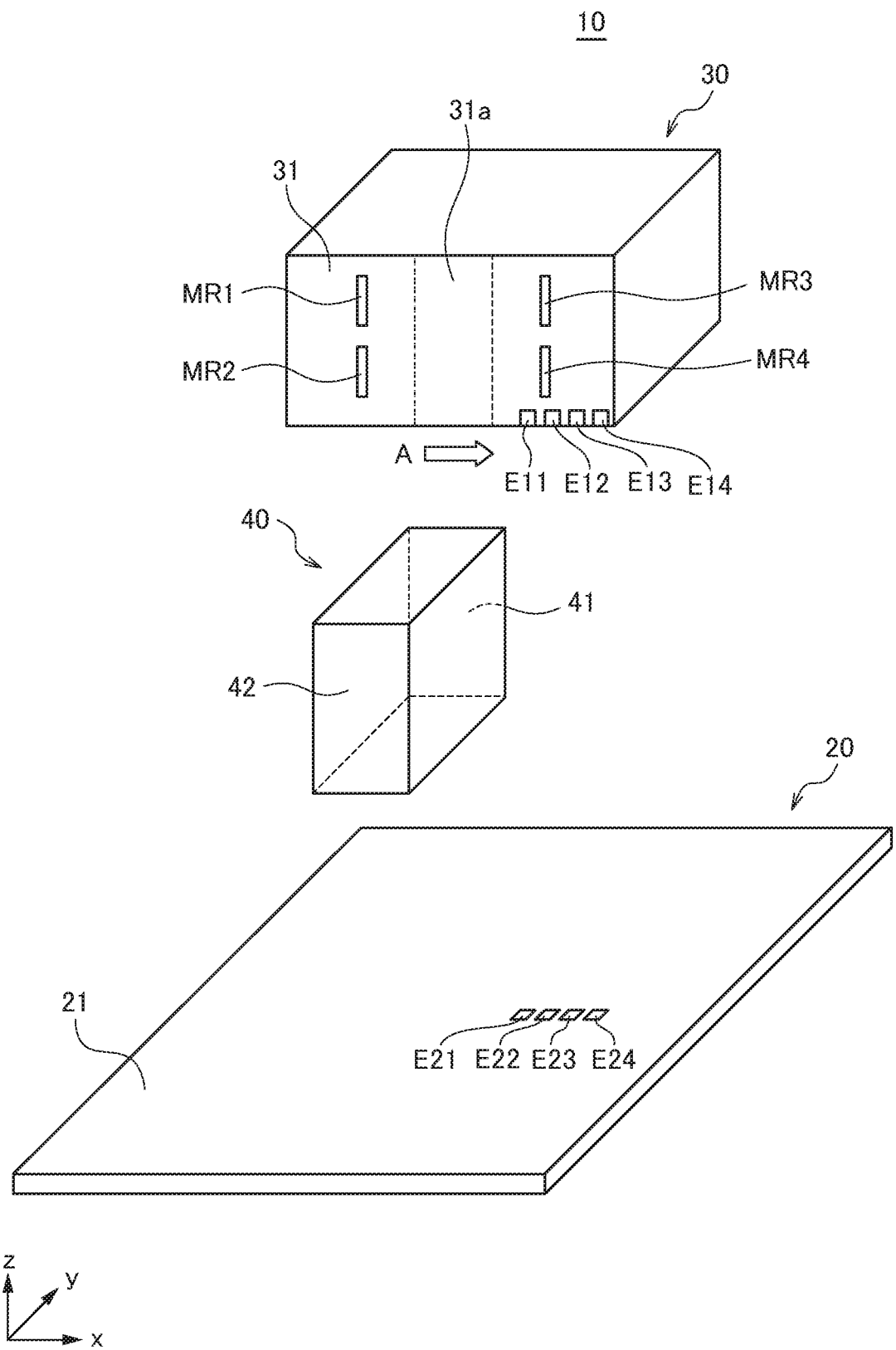
FIG. 2 is an exploded perspective view of the magnetic sensor 10.

FIG. 1 is a schematic perspective view illustrating an external appearance of a magnetic sensor 10 according to the preferred embodiment of the present invention. FIG. 2 is an exploded perspective view of the magnetic sensor 10.

As illustrated in FIGS. 1 and 2, the magnetic sensor 10 according to the present invention is constituted by a circuit board 20 and a sensor chip 30 and a magnetic member 40 mounted on a mounting surface 21 of the circuit board 20.

The circuit board 20 is a board in which a wiring pattern is formed on an insulating base of resin or the like, and a general printed circuit board or interposer circuit board can be used therefor. The mounting surface 21 of the circuit board 20 forms an xy surface, and the mounting surface 21 has the sensor chip 30 and the magnetic member 40 mounted thereon. Four land patterns E21 to E24 are provided on the mounting surface 21 of the circuit board 20. A constant voltage source and a voltage detection circuit described later are connected to the land patterns E21 to E24. The constant voltage source and the voltage detection circuit can be provided on the circuit board 20 itself or can be provided on another circuit board that is different from the circuit board 20.

The sensor chip 30 has a substantially rectangular cuboid shape, and four magnetism detection elements MR1 to MR4 are formed on an element-forming surface 31. As illustrated in FIGS. 1 and 2, the element-forming surface 31 forms an xz surface. That is, the sensor chip 30 is mounted horizontally such that the element-forming surface 31 is substantially orthogonal to the mounting surface 21 of the circuit board 20.

Figure 3:
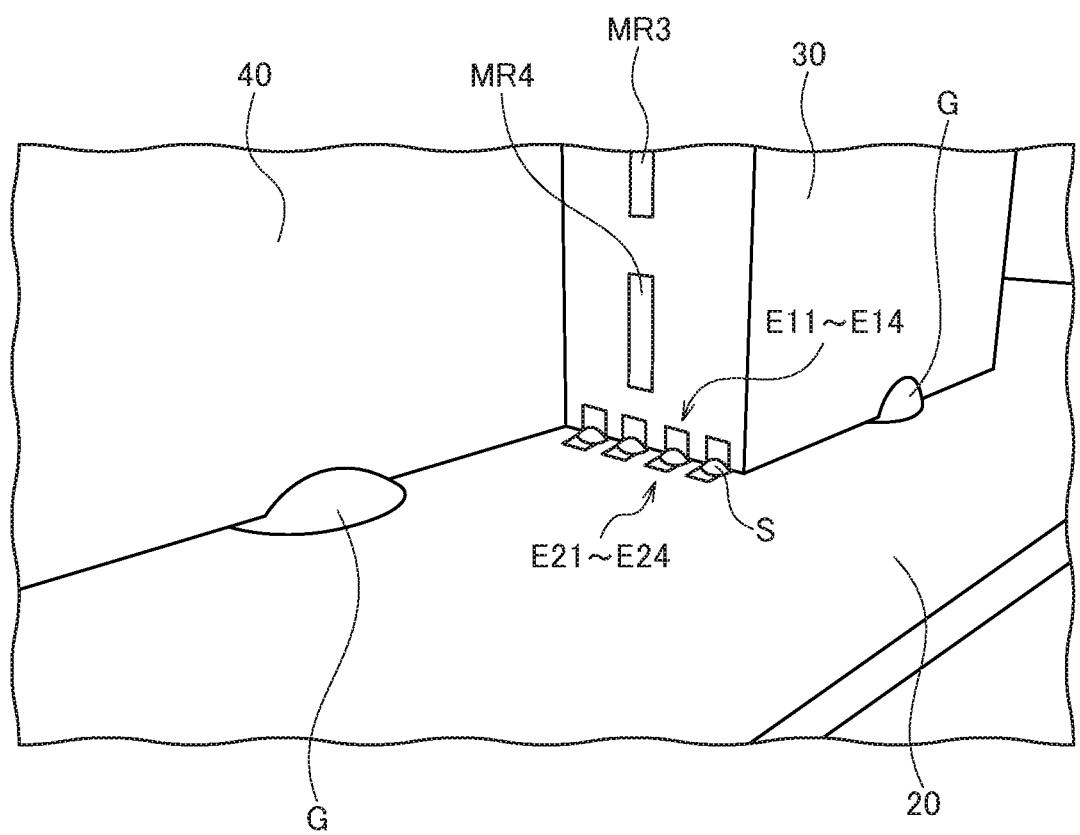
FIG. 3 is a partial enlarged view of the magnetic sensor 10.

While the sensor chip 30 is fixed to the circuit board 20, the bottom surface (the xy surface) of the sensor chip 30 and the mounting surface 21 of the circuit board 20 do not need to be in close contact, and there can be an adhesive applied between the two surfaces. As illustrated in FIG. 3, which is an enlarged view, it is permissible that an adhesive G provided in a partial manner fixes the bottom surface (the xy surface) of the sensor chip 30 and the mounting surface 21 of the circuit board 20 to each other while leaving a slight gap existing therebetween.

The magnetism detection elements MR1 to MR4 are not particularly limited to any type as long as the elements change in physical characteristics depending on the magnetic flux density. In the present embodiment, magnetoresistive elements (MR elements) that change in the electrical resistance according to the direction of a magnetic field are used. The fixed directions of magnetization of the magnetism detection elements MR1 to MR4 are all aligned in a direction (to the plus side in the x-direction) indicated by an arrow A in FIG. 2. A large number of the sensor chips 30 are produced by using an aggregate board, so that multiple pieces are obtained by dicing. In this manner, in the present embodiment, the sensor chip 30 resulting from the dicing is mounted on the circuit board 20 at 90° in a horizontal state.

Further, four terminal electrodes E11 to E14 are provided on the element-forming surface 31 of the sensor chip 30. The terminal electrodes E11 to E14 are respectively connected to the land patterns E21 to E24 via solder S. The connecting relation between the terminal electrodes E11 to E14 and the magnetism detection elements MR1 to MR4 are described below.

The magnetic member 40 is a block formed of a high permeability material such as ferrite, and is in a substantially rectangular cuboid shape in the present embodiment. An xz surface of the magnetic member 40 forms a first side surface 41 facing the element-forming surface 31 of the sensor chip 30. The area of the first side surface 41 is smaller than the area of the element-forming surface 31 of the sensor chip 30 and is mounted on the circuit board 20 to face an opposing region 31a located between the magnetism detection elements MR1 and MR2 and the magnetism detection elements MR3 and MR4. The first side surface 41 of the magnetic member 40 and the opposing region 31a of the sensor chip 30 can be in close contact with each other, or there can be a slight gap existing between the two elements. Note that, in the present embodiment, the sensor chip 30 and the magnetic member 40 do not need to be fixed by an adhesive or the like, because the sensor chip 30 and the magnetic member 40 are both placed on the mounting surface 21 of the circuit board 20.

While the magnetic member 40 is fixed to the circuit board 20, the bottom surface (the xy surface) of the magnetic member 40 and the mounting surface 21 of the circuit board 20 do not need to be in close contact, and there can be an adhesive applied between the two surfaces. As illustrated in FIG. 3, which is an enlarged view, it is permissible that the adhesive G provided in a partial manner fixes the bottom surface (the xy surface) of the magnetic member 40 and the mounting surface 21 of the circuit board 20 to each other while leaving a slight gap existing therebetween.

While the length of the magnetic member 40 in the y-direction is not particularly limited to any length, increasing the length in the y-direction can enhance the selectivity of the magnetic flux in the y-direction. Because the y-direction is parallel to the mounting surface 21 of the circuit board 20 in the present embodiment, increasing the length of the magnetic member 40 in the y-direction does not cause the support of the magnetic member 40 to become unstable.

Figure 4:
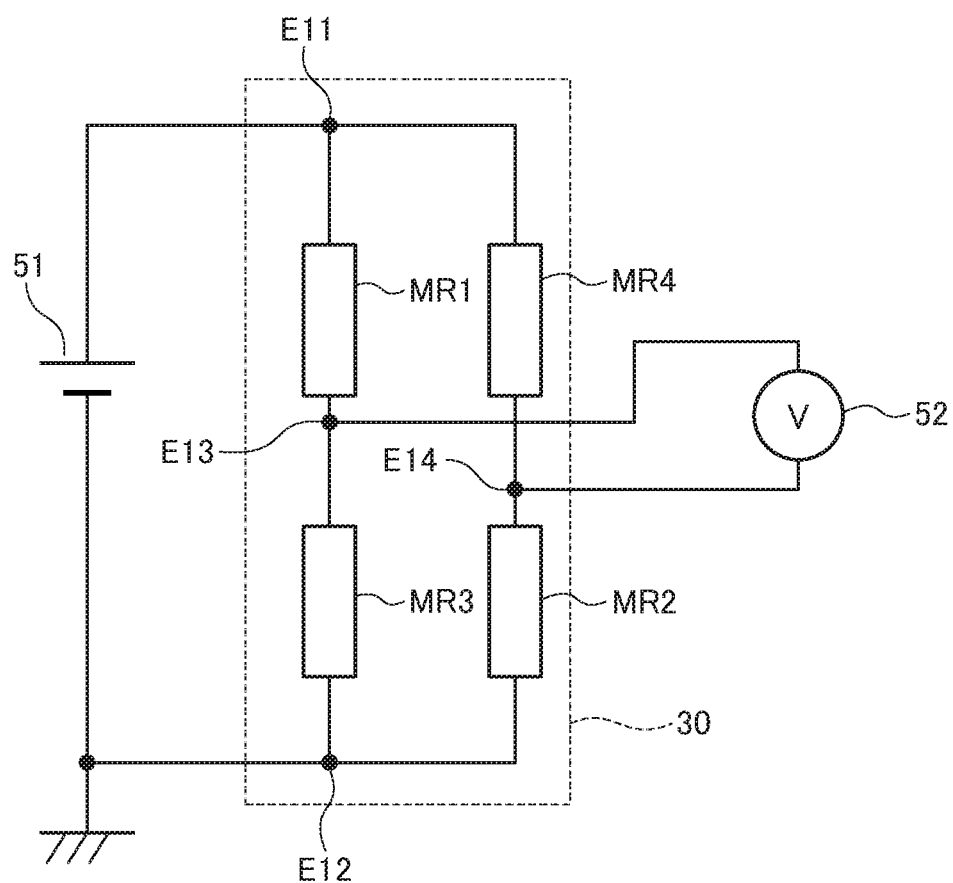
FIG. 4 is a circuit diagram for explaining a connecting relation between the terminal electrodes E11 to E14 and the magnetism detection elements MR1 to MR4.

FIG. 4 is a circuit diagram for explaining a connecting relation between the terminal electrodes E11 to E14 and the magnetism detection elements MR1 to MR4.

As illustrated in FIG. 4, the magnetism detection element MR1 is connected between the terminal electrodes E11 and E13, the magnetism detection element MR2 is connected between the terminal electrodes E12 and E14, the magnetism detection element MR3 is connected between the terminal electrodes E12 and E13, and the magnetism detection element MR4 is connected between the terminal electrodes E11 and E14. A predetermined voltage is applied between the terminal electrodes E11 and E12 by a constant voltage source 51. A voltage detection circuit 52 is connected between the terminal electrodes E13 and E14 to accordingly detect the level of an output voltage that appears between the terminal electrodes E13 and E14.

The magnetism detection elements MR1 and MR2 are arranged on one side (the minus side in the x-direction) as viewed from the opposing region 31a, and the magnetism detection elements MR3 and MR4 are arranged on the other side (the plus side in the x-direction) as viewed from the opposing region 31a. Therefore, the magnetism detection elements MR1 to MR4 forms a differential bridge circuit, allowing a change in the electrical resistance of the magnetism detection elements MR1 to MR4 to be detected with high sensitivity according to the magnetic flux density.

Specifically, the magnetic flux in a direction (to the plus side in the y-direction) indicated by an arrow B in FIG. 1 is mainly drawn toward a second side surface 42 of the magnetic member 40, passes through the inside of the magnetic member 40 in the y-direction, and then is output mainly from the first side surface 41. The magnetic flux output from the first side surface 41 moves around the both sides in the x-direction and returns to an originating source of the magnetic flux. At this time, the magnetism detection elements MR1 to MR4 all have the same fixed direction of magnetization. Therefore, a difference occurs between the amount of change in the resistance of the magnetism detection elements MR1 and MR2 located on one side as viewed from the opposing region 31a and the amount of change in the resistance of the magnetism detection element MR3 and MR4 located on the other side as viewed from the opposing region 31a. The difference is amplified and doubled by the differential bridge circuit illustrated in FIG. 4 and is detected by the voltage detection circuit 52.

In this manner, the magnetic sensor 10 according to the present embodiment can detect the magnetic flux density in the y-direction with the voltage detection circuit 52, because the magnetic member 40 is arranged to oppose the element-forming surface 31 of the sensor chip 30. Further, in the present embodiment, because the element-forming surface 31 of the sensor chip 30 is perpendicular to the mounting surface 21 of the circuit board 20, increasing the length of the magnetic member 40 in the y-direction does not cause the fixation of the magnetic member 40 to become unstable.

A modification of the magnetic sensor 10 according to the present embodiment is described below.

Figure 5:
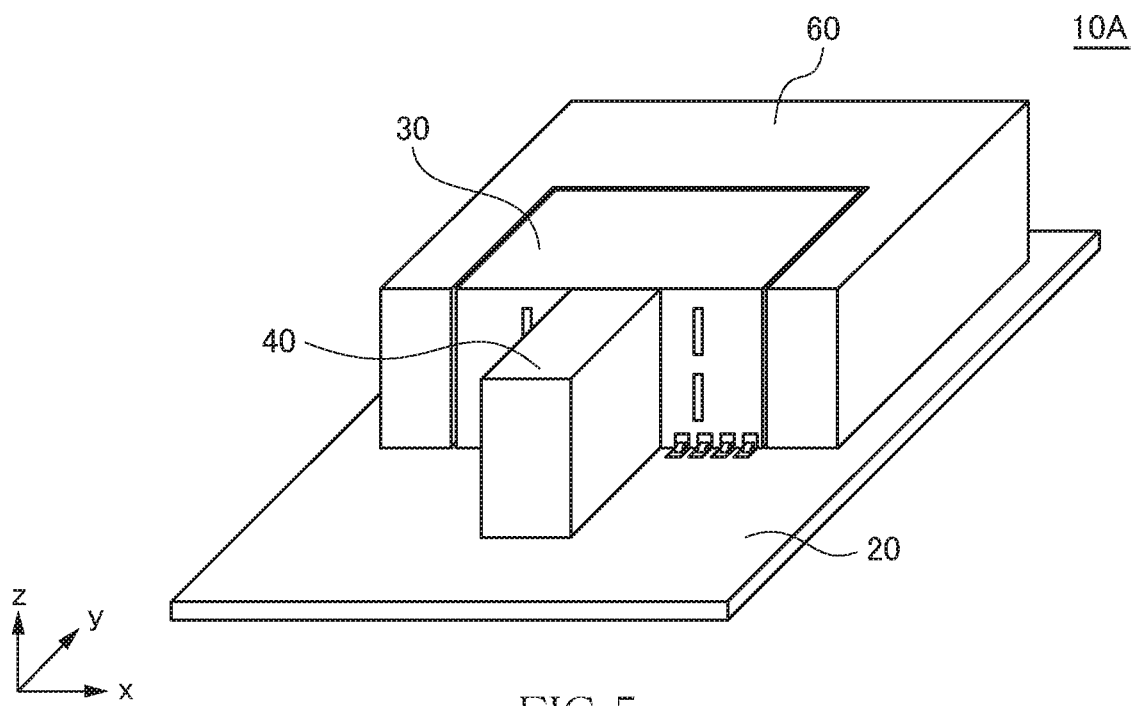
FIG. 5 is a schematic perspective view illustrating a configuration of a magnetic sensor 10A according to a first modification.

FIG. 5 is a schematic perspective view illustrating a configuration of a magnetic sensor 10A according to the first modification.

The magnetic sensor 10A illustrated in FIG. 5 differs from the magnetic sensor 10 illustrated in FIG. 1 in that an auxiliary magnetic member 60 mounted on the circuit board 20 is further provided. The auxiliary magnetic member 60 is a block formed of a high permeability material such as ferrite in a similar manner to the magnetic member 40, and has a rectangular U-shape to cover the xz surface other than the element-forming surface 31 and a yz surface of the sensor chip 30. With this configuration, the magnetic flux input to the element-forming surface 31 of the sensor chip 30 via the magnetic member 40 is easily curved in the x-direction. Therefore, the sensitivity of detection by the magnetism detection elements MR1 to MR4 can be enhanced.

Figure 6:
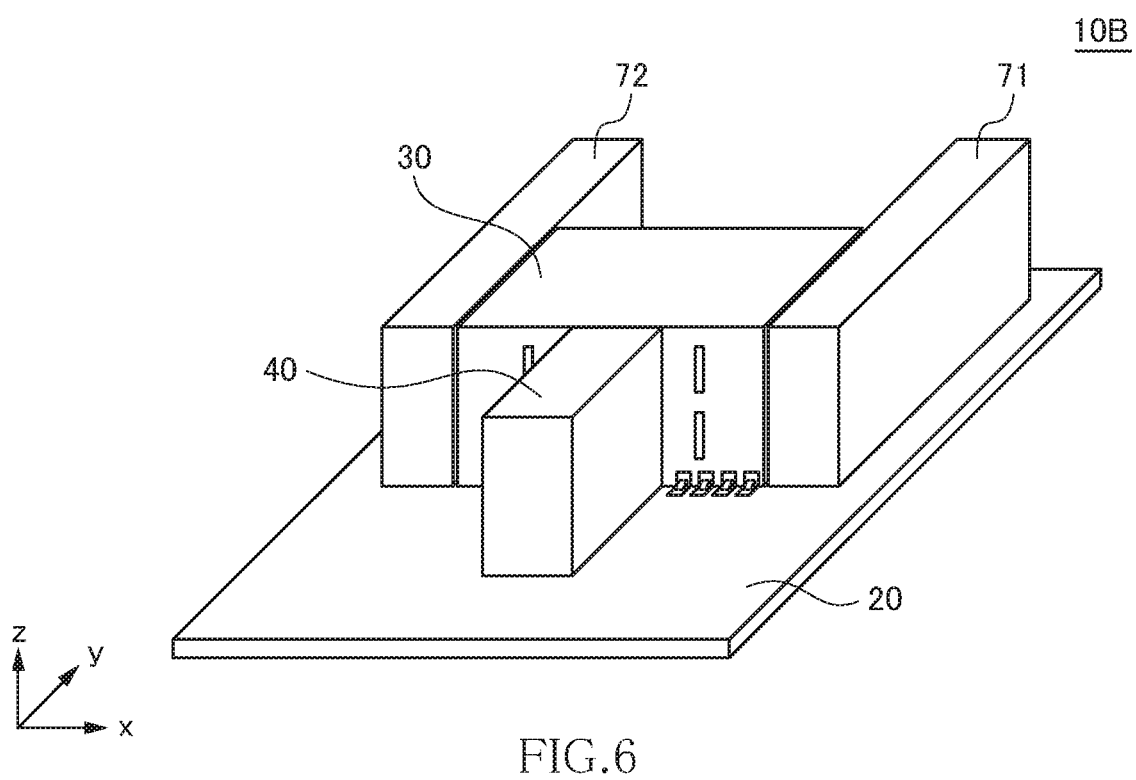
FIG. 6 is a schematic perspective view illustrating a configuration of a magnetic sensor 10B according to a second modification.

FIG. 6 is a schematic perspective view illustrating a configuration of a magnetic sensor 10B according to the second modification.

The magnetic sensor 10B illustrated in FIG. 6 differs from the magnetic sensor 10A illustrated in FIG. 5 in that the auxiliary magnetic member 60 is replaced with two auxiliary magnetic members 71 and 72. The auxiliary magnetic members 71 and 72 are the auxiliary magnetic member 60 without a portion covering the xz surface of the sensor chip 30 located on the opposite side of the element-forming surface 31. That is, it is a configuration in which the auxiliary magnetic member 71 covers one of two yz surfaces of the sensor chip 30 and the auxiliary magnetic member 72 covers the other one. With this configuration, the magnetic flux input to the element-forming surface 31 of the sensor chip 30 is more easily curved in the x-direction, and thus the sensitivity of detection by the magnetism detection elements MR1 to MR4 can be further enhanced.

In the magnetic sensors 10A and 10B according to the first and second modifications, the two yz surfaces of the sensor chip 30 are almost completely covered by the auxiliary magnetic member 60 or by the auxiliary magnetic members 71 and 72. However, it is also possible that only a part of the yz surface is covered. In this case, it is preferable to cover a portion closer to the element-forming surface 31.

Figure 7:
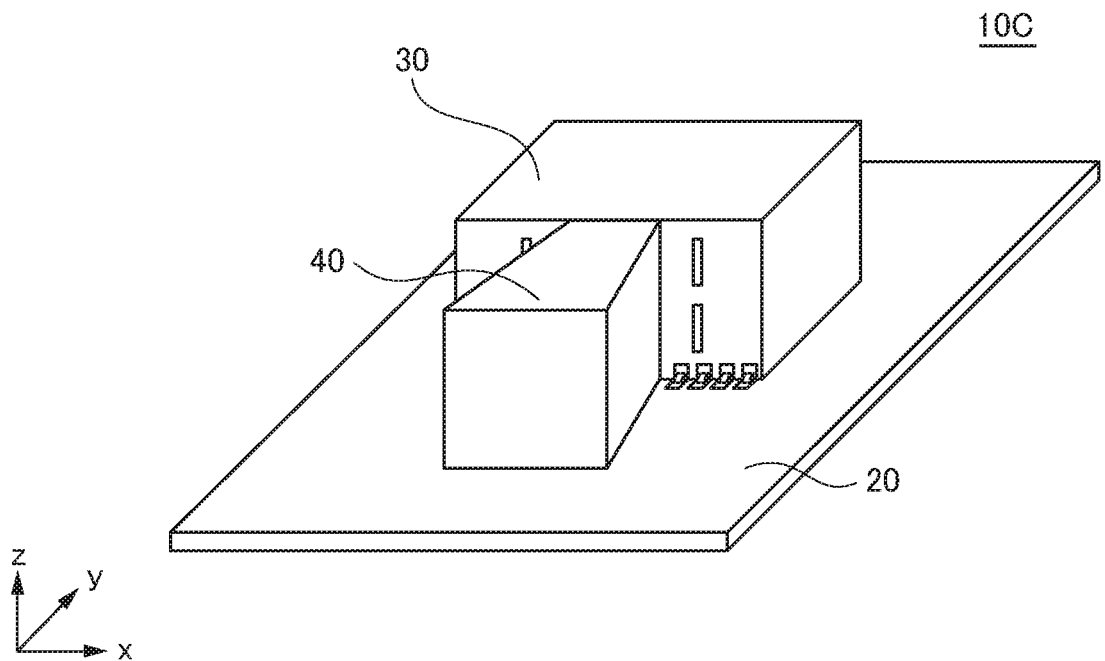
FIG. 7 is a schematic perspective view illustrating a configuration of a magnetic sensor 10C according to a third modification.

FIG. 7 is a schematic perspective view illustrating a configuration of a magnetic sensor 10C according to the third modification.

The magnetic sensor 10C illustrated in FIG. 7 differs from the magnetic sensor 10 illustrated in FIG. 1 in the shape of the magnetic member 40. The magnetic sensor 10C illustrated in FIG. 7 has a tapered shape in which the width of the magnetic member 40 in the x-direction gradually increases from the first side surface 41 toward the second side surface 42. Accordingly, more magnetic flux in the y-direction can be concentrated, because the area of the second side surface 42 is larger than the area of the first side surface 41. As a result, the sensitivity of detection by the magnetism detection elements MR1 to MR4 can be enhanced.

When the element-forming surface 31 is parallel to the mounting surface 21 of the circuit board 20, using the magnetic member 40 having such a shape causes the support of the magnetic member 40 to become highly unstable. However, because the sensor chip 30 is mounted on the circuit board 20 in a horizontal state in the present embodiment, such a problem does not occur. The fixation of the magnetic member 40 rather becomes more stable, because the area in which the magnetic member 40 is placed with respect to the circuit board 20 increases. In the magnetic sensor 10C illustrated in FIG. 7, the width of the magnetic member 40 in the x-direction increases throughout the entire region in the y-direction. However, it is permissible to have a shape that the width of the magnetic member 40 in the x-direction is constant up to a certain length in the y-direction from the first side surface 41, and the width in the x-direction increases in the remaining portion.

Figure 8:
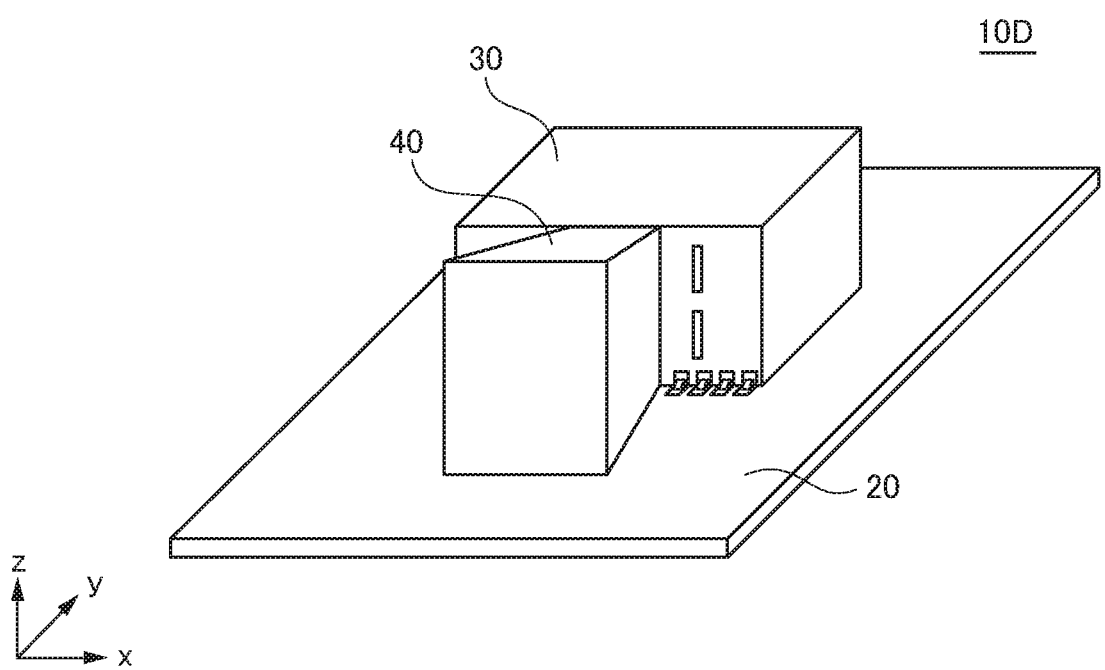
FIG. 8 is a schematic perspective view illustrating a configuration of a magnetic sensor 10D according to a fourth modification.

FIG. 8 is a schematic perspective view illustrating a configuration of a magnetic sensor 10D according to the fourth modification.

The magnetic sensor 10D illustrated in FIG. 8 differs from the magnetic sensor 10C illustrated in FIG. 7 in the tapered shape in which the height of the magnetic member 40 in the z-direction gradually increases from the first side surface 41 toward the second side surface 42. Also with such a shape, more magnetic flux in the y-direction can be concentrated, because the area of the second side surface 42 is larger than the area of the first side surface 41. It is not necessary that both of the width in the x-direction and the height in the z-direction of the magnetic member 40 are increased in a tapered manner. For example, it is permissible that only the height of the magnetic member 40 in the z-direction increases in a tapered manner.

Figure 9:
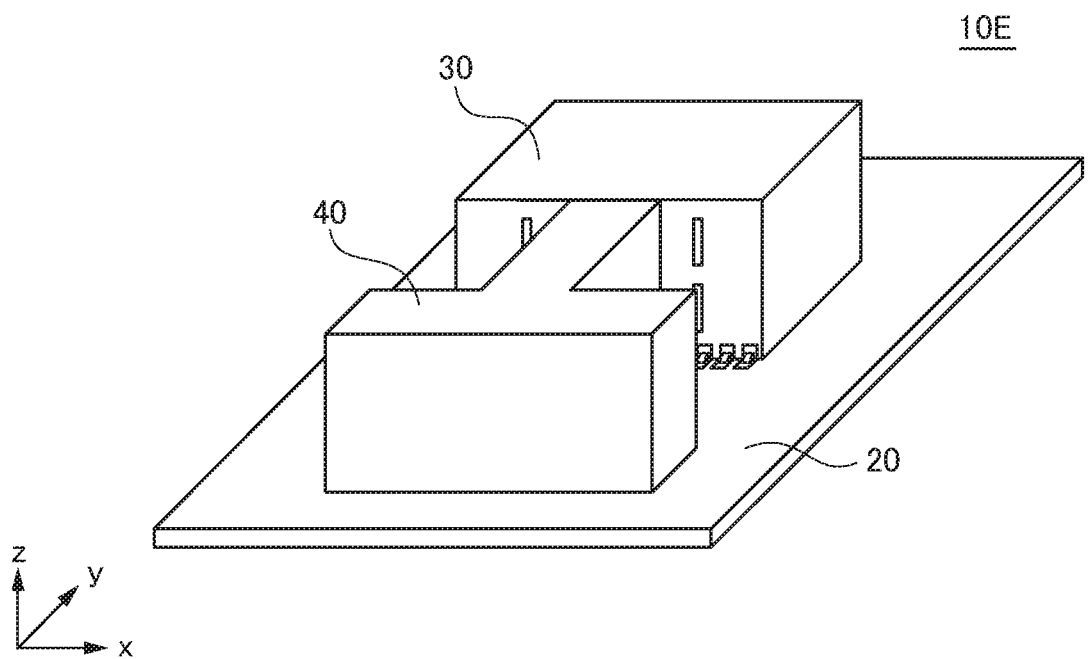
FIG. 9 is a schematic perspective view illustrating a configuration of a magnetic sensor 10E according to a fifth modification.

FIG. 9 is a schematic perspective view illustrating a configuration of a magnetic sensor 10E according to the fifth modification.

The magnetic sensor 10E illustrated in FIG. 9 differs from the magnetic sensor 10 illustrated in FIG. 1 in the shape of the magnetic member 40. In the magnetic sensor 10E illustrated in FIG. 9, the magnetic member 40 has a T-shape in planar view (as viewed from the z-direction). In other words, it is a shape that the width of the magnetic member 40 in the x-direction increases at once. Accordingly, more magnetic flux in the y-direction can be concentrated, because the area of the second side surface 42 is larger than the area of the first side surface 41. In this manner, when the width of the magnetic member 40 in the x-direction is increased, it is not necessary that the increase is made in a tapered manner, and the shape can be such that the increase made at once. Alternatively, it is permissible to have a shape that the width of the magnetic member 40 in the x-direction increases in a step-wise manner from the first side surface 41 toward the second side surface 42.

Figure 10:
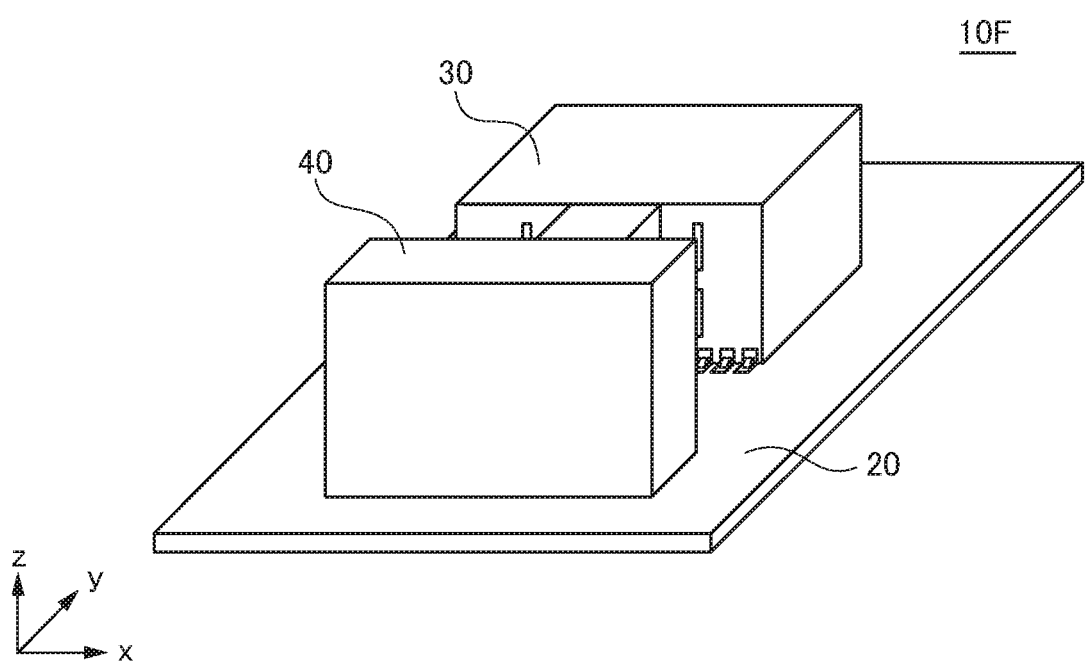
FIG. 10 is a schematic perspective view illustrating a configuration of a magnetic sensor 10F according to a sixth modification.

FIG. 10 is a schematic perspective view illustrating a configuration of a magnetic sensor 10F according to the sixth modification.

The magnetic sensor 10F illustrated in FIG. 10 differs from the magnetic sensor 10E illustrated in FIG. 9 in that the height in the z-direction of a portion forming the second side surface 42 of the magnetic member 40 increases. With such a shape, more magnetic flux in the y-direction can be concentrated, because the area of the second side surface 42 becomes even larger.

Figure 11:
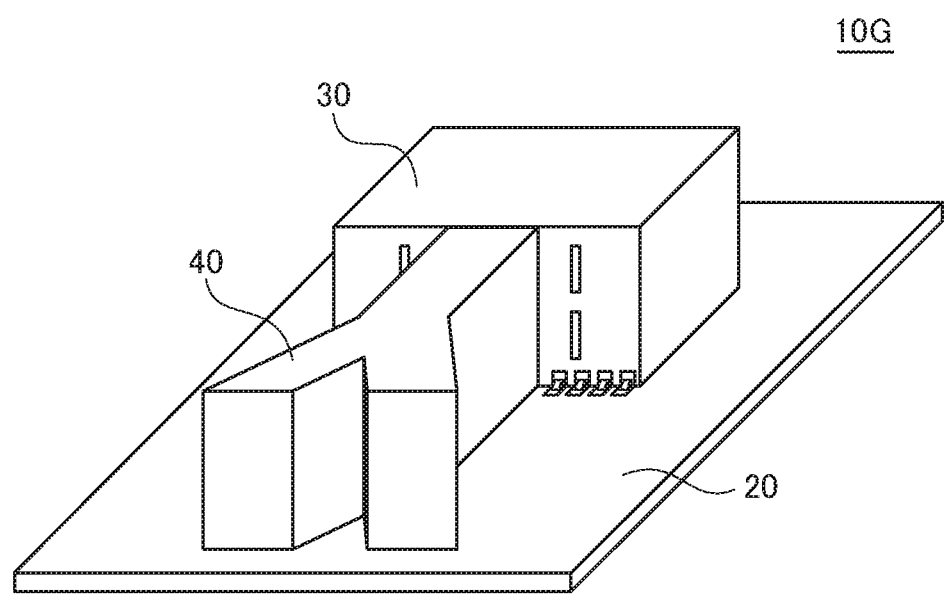
FIG. 11 is a schematic perspective view illustrating a configuration of a magnetic sensor 10G according to a seventh modification.

FIG. 11 is a schematic perspective view illustrating a configuration of a magnetic sensor 10G according to the seventh modification.

The magnetic sensor 10G illustrated in FIG. 11 differs from the magnetic sensor 10 illustrated in FIG. 1 in the shape of the magnetic member 40. In the magnetic sensor 10G illustrated in FIG. 11, the magnetic member 40 has a Y-shape in planar view (as viewed from the z-direction). In other words, the magnetic member 40 has a shape bifurcating from the first side surface 41 toward the second side surface 42. Accordingly, more magnetic flux in the y-direction can be concentrated, because the area of the second side surface 42 is, for example, double the area of the first side surface 41. In this manner, the second side surface 42 can be provided in plural.

It is apparent that the present invention is not limited to the above embodiments, but may be modified and changed without departing from the scope and spirit of the invention.

For example, in the embodiment described above, four magnetoresistive elements (MR elements) are used as magnetism detection elements; however, the type and number of the magnetism detection elements are not particularly limited to any specific one.

REFERENCE SIGNS LIST

10, 10A-10G: magnetic sensor
20: circuit board
21: mounting surface
30: sensor chip
31: element-forming surface
31*a*: opposing region
40: magnetic member
41: first side surface
42: second side surface
51: constant voltage source
52: voltage detection circuit
60, 71, 72: auxiliary magnetic member
E11-E14: terminal electrode
E21-E24: land pattern G: adhesive
MR1-MR4: magnetism detection element
S: solder

What is claimed is:

1. A magnetic sensor comprising:
a sensor chip including an element-forming surface provided with a magnetism detection element;
a magnetic member including a first side surface facing the element-forming surface; and
a circuit board including a mounting surface on which the sensor chip and the magnetic member are mounted,
wherein the sensor chip and the magnetic member are mounted on the circuit board such that the element-forming surface and the first side surface are substantially orthogonal to the mounting surface of the circuit board,
wherein a longitudinal direction of the magnetic member is perpendicular to the first side surface thereof,
wherein the magnetic member is fixed to the circuit board by adherence to the mounting surface of the circuit board via an adhesive, and
wherein the first side surface is smaller in area than the element-forming surface.

2. The magnetic sensor as claimed in claim 1,
wherein the magnetic member further includes a second side surface substantially parallel to the first side surface and located on an opposite side of the first side surface, and
wherein an area of the second side surface is larger than an area of the first side surface.

3. The magnetic sensor as claimed in claim 2, wherein a length of the second side surface in a direction perpendicular to the mounting surface is larger than a length of the first side surface in the direction perpendicular to the mounting surface.

4. The magnetic sensor as claimed in claim 1,
wherein the magnetism detection element includes first to fourth magnetoresistive elements,
wherein the first and second magnetoresistive elements are located on one side as viewed from the first side surface of the magnetic member, and
wherein the third and fourth magnetoresistive elements are located on other side as viewed from the first side surface of the magnetic member.

5. The magnetic sensor as claimed in claim 4, further comprising an auxiliary magnetic member mounted on the circuit board,
wherein the sensor chip further includes first and second side surfaces substantially orthogonal to the element-forming surface and located respectively on the one side and the other side as viewed from the first side surface of the magnetic member, and
wherein the auxiliary magnetic member is mounted on the circuit board so as to cover at least a part of the first and second side surfaces.

* * * * *